(12) United States Patent  (10) Patent No.: US 7,667,329 B2
Rogge  (45) Date of Patent: Feb. 23, 2010

(54) ELECTRONIC MICROMODULE AND METHOD FOR MANUFACTURING THE SAME

(75) Inventor: Agnes Rogge, Puyloubier (FR)

(73) Assignee: STMicroelectronics SA, Montrouge (FR)

( * ) Notice: Subject to any disclaimer, the term of this patent is extended or adjusted under 35 U.S.C. 154(b) by 465 days.

(21) Appl. No.: 11/561,699

(22) Filed: Nov. 20, 2006

(65) Prior Publication Data

US 2007/0148981 A1  Jun. 28, 2007

(30) Foreign Application Priority Data

Nov. 21, 2005  (FR) .................................. 05 11750

(51) Int. Cl.
*H01L 29/40*  (2006.01)
(52) U.S. Cl. ........................ 257/773; 257/777; 257/486; 438/597; 438/612
(58) Field of Classification Search .................. 257/773, 257/777, 786; 438/597, 612
See application file for complete search history.

(56) References Cited

U.S. PATENT DOCUMENTS

| 5,387,551 A | 2/1995 | Mizoguchi et al. .......... 437/209 |
| 6,268,796 B1 * | 7/2001 | Gnadinger et al. ....... 340/572.5 |

FOREIGN PATENT DOCUMENTS

| EP | 1 069 645 | 1/2001 |
| EP | 1 467 315 | 10/2004 |
| WO | 00/77852 | 12/2000 |
| WO | 01/45164 | 6/2001 |

* cited by examiner

*Primary Examiner*—Bradley K Smith
(74) *Attorney, Agent, or Firm*—Lisa K. Jorgenson; Robert Iannucci; Seed IP Law Group PLLC

(57) ABSTRACT

A method for manufacturing a micromodule comprising an integrated circuit and an antenna coil electrically connected to the integrated circuit. The method includes manufacturing the integrated circuit and first contact pads of the integrated circuit on a first wafer of semiconductor material, making a conductive winding forming a coil and second contact pads of the coil on a second wafer of semiconductor material, and assembling the first and the second wafers face to face while putting the second contact pads of the coil in contact with the second contact pads of the integrated circuit.

18 Claims, 4 Drawing Sheets

ELECTRONIC MICROMODULE AND METHOD FOR MANUFACTURING THE SAME

BACKGROUND OF THE INVENTION

1. Field of the Invention

The present invention relates to a method for manufacturing an electronic micromodule, and more particularly a contactless micromodule comprising an integrated circuit and an antenna coil electrically connected to the integrated circuit.

2. Description of the Related Art

An integrated circuit usually comes in the form of a silicon chip which comprises an active region implanted in the silicon, and contact pads electrically linked to the active region. Some integrated circuits called contactless, like PICC circuits (Proximity Inductive Coupling Circuit) described by the ISO/IEC 14443 and 15693 standards, are intended to be connected to an antenna coil which is the interface between the integrated circuit and the external environment, for receiving and sending data. These integrated circuits comprise means for receiving and/or sending data by inductive coupling by means of the antenna coil, in presence of a magnetic field emitted by a station for sending and/or receiving data. They are used for the manufacture of contactless electronic micromodules which are fixed on or in portable objects like plastic cards, tokens, keys, books, etc, in order to authenticate and/or identify the portable objects.

A manufacturing method often used to make a contactless micromodule consists in providing a support wafer in paper or in plastic on which the antenna coil is made by screen printing a conducting paste or etching a conducting layer. The integrated circuit is then laid down on the support wafer, and its contact pads are connected to the coil.

However, this method imposes technological constraints concerning the thickness and the surface of the micromodule. Thus, the total thickness of the support wafer and of the antenna coil cannot be reduced beyond a minimum of about 100 µm. Equally, the technological pitch (minimum distance between conductors) offered by the techniques of creeping or etching a paper or plastic support imposes a relatively big size of coil clearly superior to the size of the integrated circuit.

Another manufacturing method called "coil on chip" is also known and consists in making coils directly on integrated circuits whereas they are still present on a silicon wafer, before cutting the wafer into silicon chips. This method consists of depositing an insulating layer onto the active face of the silicon wafer (face comprising the active regions of the integrated circuits) and forming the coils on the superior insulating layer. After cutting the silicon wafer, integrated micromodules are obtained.

This method allows several assembly and connection steps to be suppressed but proves to be little reliable and not to have an optimum yield: numerous micromodules thus obtained do not operate properly and must be discarded. This problem results in particular from the fact that the active face of the integrated circuit cannot be flat, particularly because of the presence of conducting elements under the insulating layer. The result is that the thickness of the insulating layer between the coil and the active surface of the integrated circuit is not constant and is sometimes insufficient to avoid the apparition of capacitive or inductive coupling between the integrated circuit and the coil. In addition, openings are made facing the contact pads of the integrated circuit into the insulating layer to ensure the electrical and mechanical contact of the integrated circuit with the antenna. It results in significant irregularity at the surface of the insulating layer ("stairs") which may also cause electrical discontinuities in the conducting material forming the coil (not enough conducting material on the sides of the stairs). In addition, not properly polymerised dielectrics change with time and do not allow a stable adhesion of the metal. At last, bad cleaning after etching the metal can have a corrosive effect on the conductor and cause a cut of the conducting path.

BRIEF SUMMARY OF THE INVENTION

Thus, one embodiment of the present invention is a method for manufacturing a contactless micromodule without the drawbacks of known methods and with a good quality/manufacturing cost ratio.

Another embodiment of the present invention is a manufacturing method allowing micromodules to be collectively manufactured with a minimal number of assembly steps.

A further embodiment of the present invention is a manufacturing method allowing very thin micromodules to be manufactured.

One embodiment is a method for manufacturing a micromodule comprising an integrated circuit and at least one antenna coil electrically connected to the integrated circuit.

According to an embodiment of the invention, the method comprises steps of:

making the integrated circuit and contact pads of the integrated circuit on a first wafer of semiconductor material, making at least one conducting winding forming a coil and contact pads of the coil on a second wafer of semiconductor material, and assembling the first and second wafers face to face while putting the contact pads of the coil in contact with contact pads of the integrated circuit.

According to one embodiment of the invention the integrated circuit and its contact pads are formed on a first face of the first wafer, the conducting winding is formed on a first face of the second wafer, the contact pads of the coil are formed on a second face of the second wafer, and the wafers are assembled by arranging the first face of the first wafer facing the second face of the second wafer.

According to one embodiment of the invention, the method comprises steps of:

forming holes going through the second wafer between the first face on which the conducting winding is formed and the second face of the second wafer, and filling in the holes with a conducting material to obtain electrically conducting bushings linking the conducting winding to the contact pads of the coil.

According to one embodiment of the invention, forming the holes comprises a step of forming blind holes on the first face of the second wafer and a step of thinning the second wafer so that the blind holes open onto the second face of the second wafer.

According to one embodiment of the invention, the method comprises the steps of:

forming a groove in winding shape on the second wafer, and filling in the groove with an electrically conducting material, to obtain the conducting winding forming a coil.

According to one embodiment of the invention, the method comprises a step of forming bumps in an electrically conducting material on the contact pads of the coil or on the contact pads of the integrated circuit, so that an electrical contact is established by the bumps between the contact pads of the coil and the contact pads of the integrated circuit, after assembling the wafers.

According to one embodiment of the invention, the bumps are in a material belonging to the group comprising a metal, a composition of metals, an eutectic alloy and a non-eutectic hard alloy.

According to one embodiment of the invention, the method comprises a step of applying a treatment to the bumps, consisting in fusing, creep or adhesion.

According to one embodiment of the invention, the method comprises a step of depositing a polymer material on the first wafer or on the second wafer to assemble both wafers.

According to one embodiment of the invention, for collectively manufacturing micromodules, the method comprises steps of:

collectively manufacturing several integrated circuits and their contact pads on the first wafer, collectively manufacturing several conducting windings forming a coil on the second wafer, connecting each conducting winding to an integrated circuit at the time of assembling the wafers, and cutting the wafers after assembling them, to obtain individual micromodules.

According to one embodiment of the invention, for collectively manufacturing micromodules, the method comprises steps of:

collectively manufacturing several integrated circuits and their contact pads on the first wafer, collectively manufacturing several conducting windings forming a coil on the second wafer, cutting the second wafer to obtain several chips, each chip having a surface substantially matching a location of integrated circuit on the first wafer, assembling chips, each chip bearing a coil, with the first wafer so that each coil is connected to an integrated circuit, and cutting the first wafer after assembling it to the chips, to obtain individual micromodules.

According to one embodiment of the invention, for collectively manufacturing micromodules, the method comprises steps of:

collectively manufacturing several integrated circuits and their contact pads on the first wafer, collectively manufacturing several conducting windings forming a coil on the second wafer, cutting the first wafer to obtain several chips, each chip having a surface substantially matching a coil location on the second wafer, assembling chips, each chip bearing an integrated circuit, with the second wafer so that each coil is connected to an integrated circuit, and cutting the second wafer after assembling it with the chips, to obtain individual micromodules.

An embodiment of the invention also relates to a micromodule comprising an integrated circuit and at least one antenna coil comprising contact pads electrically connected to contact pads of the integrated circuit. According to the embodiment of the invention:

the integrated circuit and its contact pads are made on a first chip of semiconductor material, the antenna coil and its contact pads are made on a second chip of semiconductor material, and the first and second chips are assembled face to face, putting the contact pads of the coil in contact with contact pads of the integrated circuit, which match the contact pads of the coil due to their locations.

According to one embodiment of the invention:

the integrated circuit and its contact pads are arranged on a first face of the first chip, the antenna coil is arranged on a first face of the second chip, the contact pads of the coil are arranged on a second face of the second chip, and the first face of the first chip is facing the second face of the second chip.

According to one embodiment of the invention, the second chip comprises holes filled in with conducting material, going through the chip and linking the antenna coil on the first face of the second chip to the contact pads of the coil on the second face of the chip.

According to one embodiment of the invention, the antenna coil comprises a conducting material arranged in a groove in winding shape present on the first face of the second chip.

According to one embodiment of the invention, the micromodule comprises electrically conducting bumps linking the contact pads of the antenna coil to contact pads of the integrated circuit which match the contact pads of the coil due to their locations.

BRIEF DESCRIPTION OF THE SEVERAL VIEWS OF THE DRAWINGS

According to one embodiment of the invention, the micromodule comprises a polymer material spreading between the contact pads of the antenna coil and the corresponding contact pads of the integrated circuit.

Features of embodiments of the present invention will be presented in greater detail in the following description of the embodiments of the invention, given in relation with, but not limited to the following figures.

DETAILED DESCRIPTION OF THE INVENTION

Figure 1:
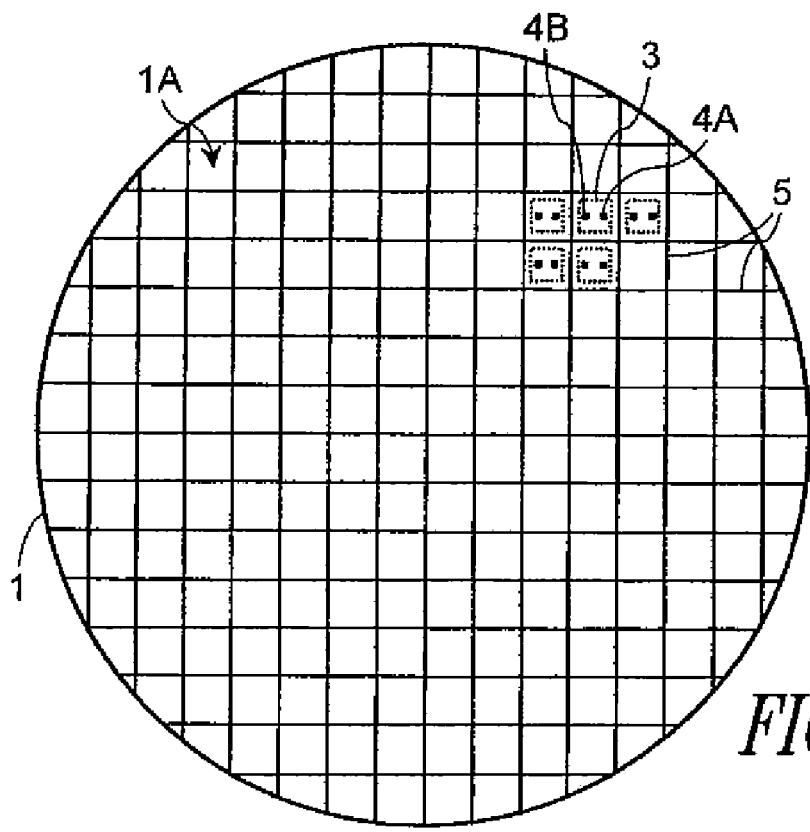
FIG. 1 is a top view of a silicon wafer on which integrated circuits are collectively manufactured, according to one illustrated embodiment.
Figure 2:
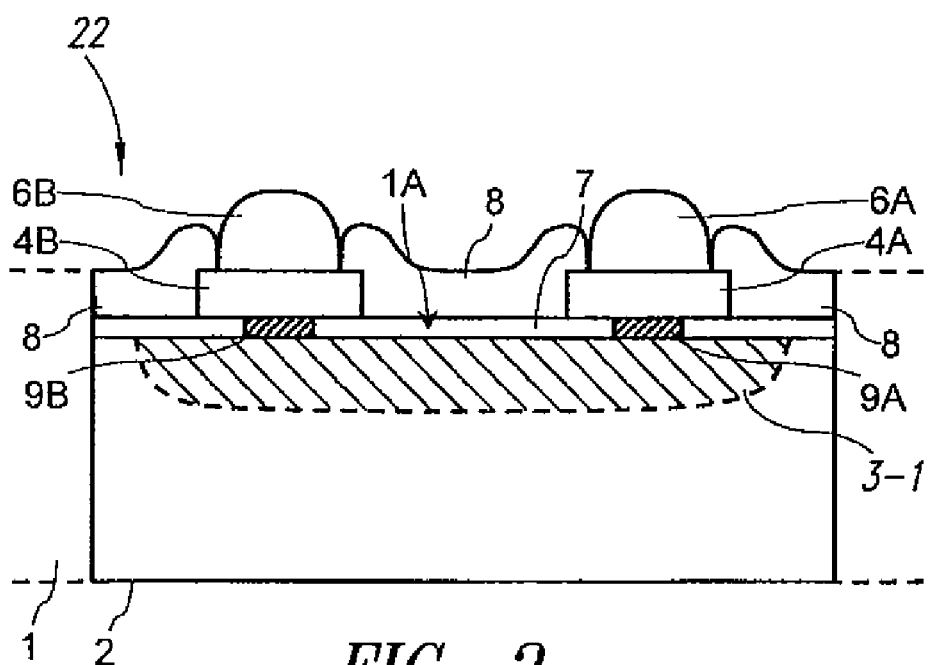
FIG. 2 is a cross-sectional view of a region of the wafer of FIG. 1.
Figure 4:
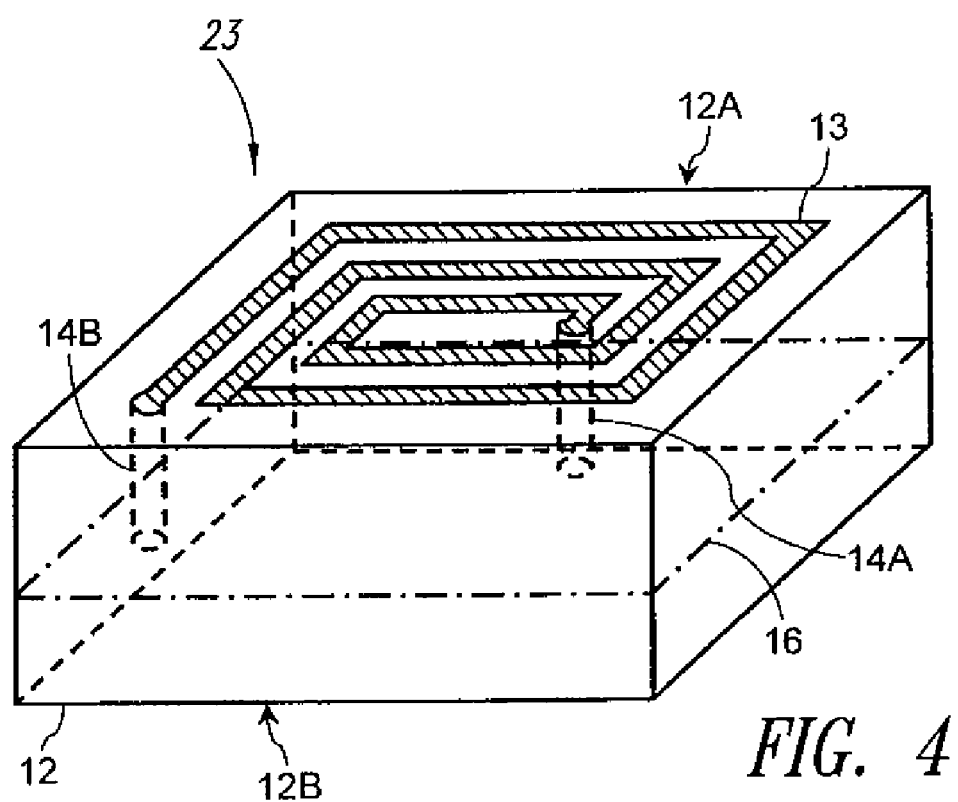
FIG. 4 is a perspective view of a region of the wafer of FIG. 3, according to one illustrated embodiment.
Figure 4A:
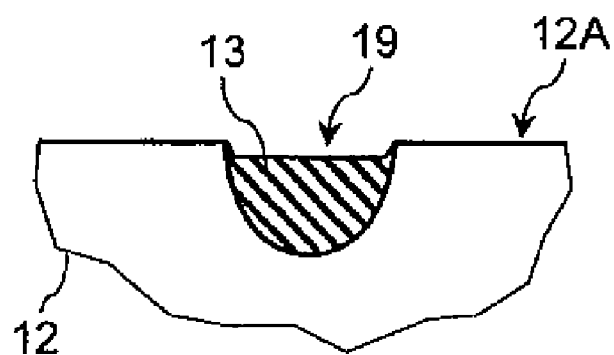
FIG. 4A is a cross-sectional view of a part of an antenna coil shown in FIG. 4, according to one illustrated embodiment.
Figure 5:
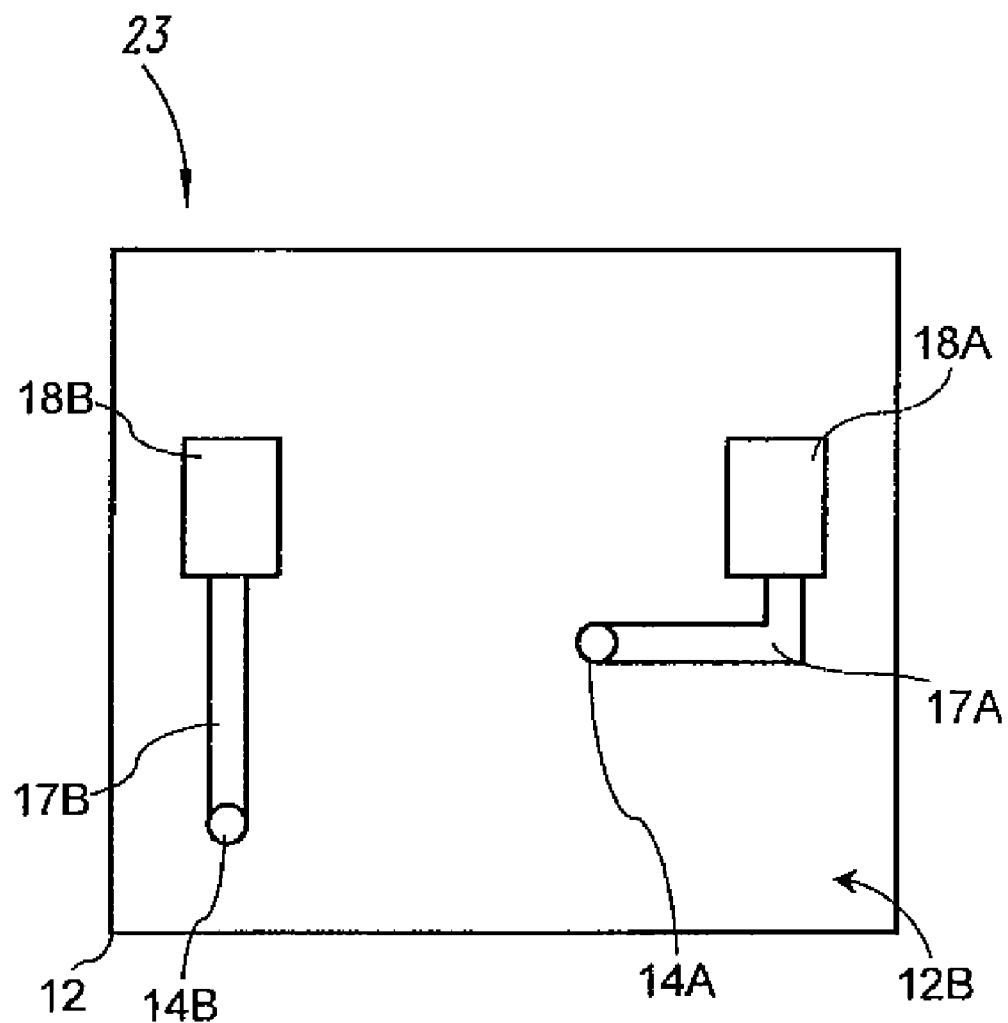
FIG. 5 is a bottom view of the region of the wafer shown in FIG. 4, according to one illustrated embodiment.
Figure 6:
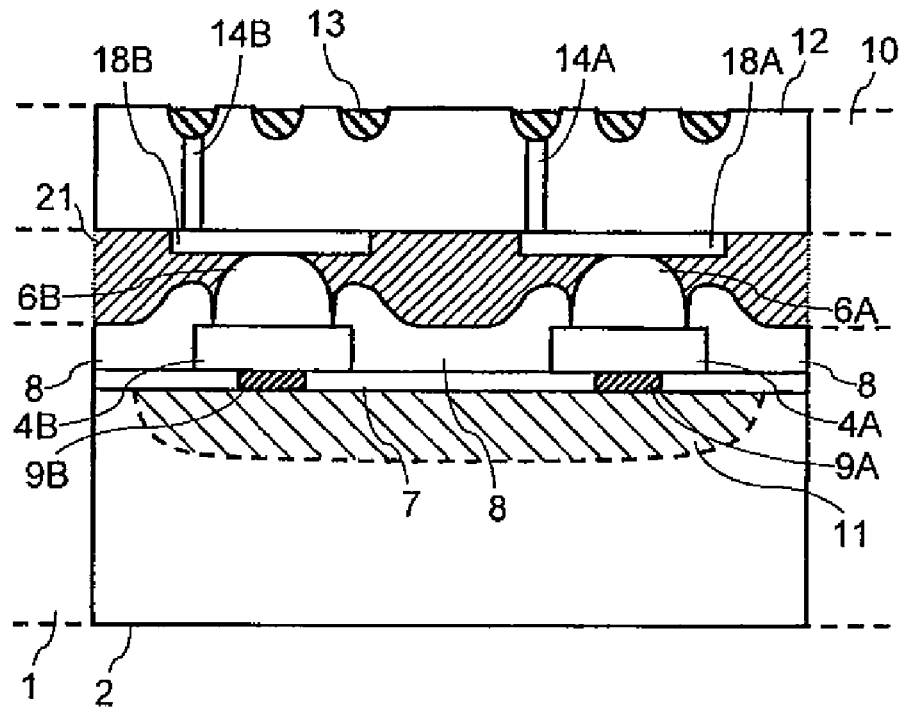
FIG. 6 is a cross-sectional view illustrating a step of assembling the wafer of FIG. 1 to the wafer of FIG. 3, according to one illustrated embodiment.

According to one embodiment of the invention, the manufacture of electronic micromodules of contactless type comprises the following steps:

a step of collectively manufacturing integrated circuits 3 on a first silicon wafer 1, illustrated in FIGS. 1 and 2, a step of collectively manufacturing antenna coils 13 on a second silicon wafer 10, illustrated in FIGS. 3, 4, 4A and 5, a step of assembling wafers 1, 10 (assembly of "wafer against wafer" type) and connecting each antenna coil 13 to an integrated circuit 3 shown in FIG. 6, and a step of cutting wafers 1, 10 after assembly (not shown), in order to obtain preassembled individual micromodules, each micromodule comprising an integrated circuit 3 and an antenna coil 13.

The silicon wafer 1 shown in FIG. 1 comprises an active face 1A on which the integrated circuits 3 have been collectively implanted. The locations of the integrated circuits 3 are delimited by scribe lines 5 along which the wafer will be subsequently cut, forming a square pattern on the active face 1A.

FIG. 2 is a cross-sectional view of a region 2 of the wafer 1 matching a location of integrated circuit 3 delimited by scribe lines (FIG. 1), and schematically shows the structure of the integrated circuit 3 (here all the integrated circuits of the wafer 1 are assumed to be identical).

The integrated circuit 3 comprises an active region 3-1 schematically indicated by hatching. This active region 3-1 comprises several active and passive components obtained by implanting dopants in the silicon wafer and by depositing and/or growing insulating materials (oxides) and conducting materials (metals, polysilicon) on the surface of the silicon wafer. All these active and passive components perform the electronic function desired, here a function of inductive coupling circuit of PICC type.

The integrated circuit 3 further comprises contact pads 4A, 4B for connecting an antenna coil to the active region 3-1. The contact pads are linked to the active region 3-1 through electrically conducting bushings 9A, 9B which spread across an insulating layer 7 covering the whole surface of the wafer 1.

The active face 1A of the wafer 1 is also covered by a protective layer 8 (passivation layer) comprising openings at the locations of the contact pads 4A, 4B.

Eventually, bumps 6A, 6B about 15 to 80 µm high are formed on the contact pads 4A, 4B. The bumps are in an electrically conducting material, for example gold, copper, and/or a composition of metals like nickel/gold, and/or an eutectic alloy, stain-lead or stain-silver-copper, or a non-eutectic alloy.

Figure 3:
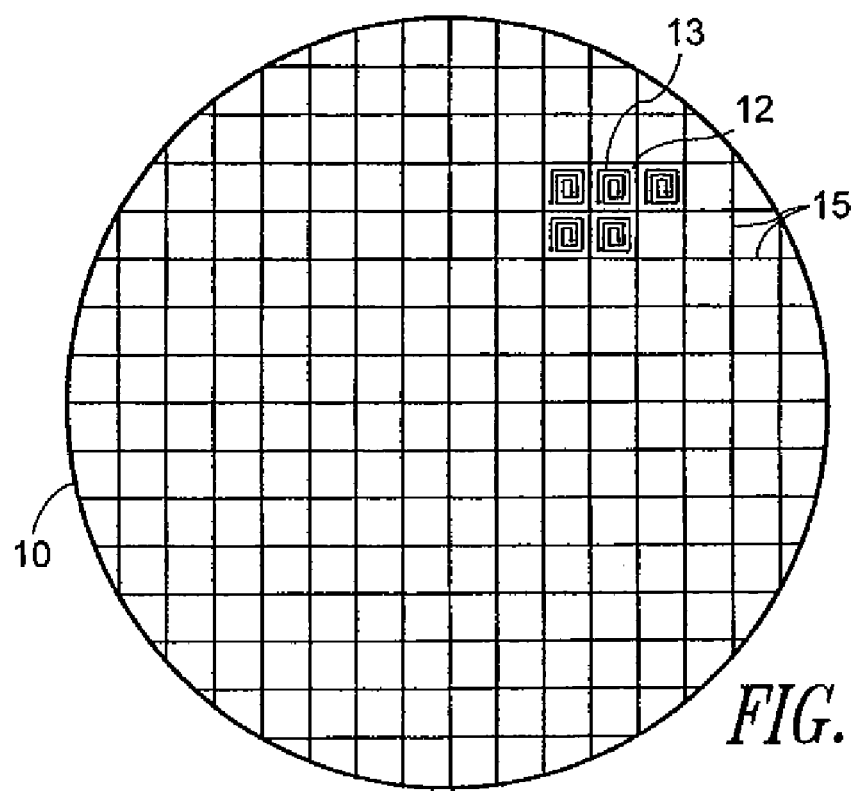
FIG. 3 is a top view of a silicon wafer on which antenna coils are collectively manufactured, according to one illustrated embodiment.

The silicon wafer 10 shown in FIG. 3 comprises a front face 12A on which the antenna coils 13 have been collectively implanted. The locations of the antenna coils 13, like the locations of the integrated circuits of the wafer 1, are delimited by scribe lines 15 forming a network on the front face 12A, along which the wafer 10 will be subsequently cut.

It is also assumed here that all the antenna coils 13 are identical. However, if several types of integrated circuits are provided on the wafer 1, the wafer 10 can comprise coils of different types, each type of coil being adapted to a type of integrated circuit.

FIGS. 4 and 5 show, in top view and bottom view, respectively, a region 12 of the wafer 10 corresponding to a location of antenna coil 13 delimited by scribe lines (FIG. 3).

Each antenna coil 13 is made by first forming on the front face 12A of the wafer 10 a groove 19 in the shape of a winding here comprising several coplanar turns. This groove, shown in cross-sectional view in FIG. 4A, is about 5 to 30 µm deep. It is formed by dry etching, wet etching, laser etching or any other method used to make a groove in a silicon wafer.

During a following step shown in FIG. 4, blind holes 14A, 14B, about 30 to 50 µm deep and which diameter is about 10 to 30 µm, are formed in the wafer 10, at the ends of the groove 19. The blind holes are for example made by subjecting the front face 12A of the wafer 10 to a gaseous plasma ($CF_4$ or $CF_6$) through a mask. The blind holes can also be made using a laser beam.

The groove 19 and the blind holes 14A, 14B are then filled in with an electrically conducting material like aluminium, copper or gold, or an alloy, after depositing a barrier layer (Titanium, Titanium nitride, Tungsten, etc.) and, if need be, an adhesion layer.

During a following step, the wafer 10 is subjected to a thinning step (backlap) by mechanical and/or chemical abrasion of its rear face 12B, until reaching a plane 16 such that the blind holes 14A, 14B open onto the rear face 12B and thus form conducting bushings 14A, 14B. From a standard thickness of the wafer 10 of about 700 µm, the thickness of the wafer can thus be brought to a value lower than 100 µm and advantageously of about 30 µm, using a support allowing the wafer to be handled without being broken.

During a step shown in FIG. 5, contact pads 18A, 18B are formed on the rear face 12B of the wafer. The contact pads 18A, 18B are linked to the bushings 14A, 14B by conducting paths 17A, 17B and are located so that they face the contact pads 4A, 4B of an integrated circuit (FIGS. 1 and 2) when the wafers 1 and 10 are assembled. Previously, a barrier and adhesion layer can be deposited on the rear face 12B.

In one embodiment, the locations where the bushings 14A, 14B open match the locations of the contact pads 4A, 4B of an integrated circuit. In that case, the contact pads 18A, 18B are made above the bushings 14A, 14B. It is also possible not to provide the contact pads 18A, 18B if the bushings 14A, 14B are of a sufficient diameter to form good contact pads at the locations where they open.

The conducting paths 17A, 17B and, if need be, the contact pads 18A, 18B, are made by depositing a conductor through a metallization mask, or in the same way as the winding forming the coil 13, by forming grooves in the rear face 12B and by filling in the grooves with an electrically conducting material.

FIG. 6 shows the step of assembling the wafers 1 and 10 ("wafer against wafer" assembly). To simplify the drawing, only one region 2 of the wafer 1 of the type shown in FIG. 2 and one region 12 of the wafer 10 of the type shown in FIG. 4 are represented in FIG. 6 (the diagram being identical and repetitive for the other regions of the wafers 1, 10 which are here considered as identical).

During this assembly step, the wafers 1 and 10 are brought face to face so that the bumps 6A, 6B of each integrated circuit 3 come into contact with the contact pads 18A, 18B of a corresponding antenna coil 13, the alignment of the wafers 1 and 10 being obtained thanks to a guidance system equipped with cameras. Preferably, the rear face 12B of the wafer 10 has been previously covered by a protective layer 11, for example polyimide, fitted with openings at the locations corresponding to the contact pads 18A, 18B.

The actual assembly of the wafers 1 and 10 is ensured by fusing the bumps in presence of a heat source, by creeping the bumps pressing the wafers one against the other, or by sticking. This is worth noting that in the field of bump assembly of components (particularly assemblies of "flip chip" type), the techniques most commonly used to that end are creep under load in presence of a heat source or sticking. When the wafers are assembled by sticking, the adhesive used comes in the form of paste or polymer film. In that case, it is necessary to make vents in the scribing lines in the same way as the vias, to allow gas to be removed from the polymers of the adhesive during the heating of the same.

As shown in FIG. 6, the adhesion of the two wafers 1 and 10 can be reinforced by means of a paste or a non-conducting adhesive film 21 arranged between the two wafers before assembly.

In addition, the wafer 1 can be advantageously thinned after its assembly with the wafer 10 which is then used as support. The total thickness of the assembled wafers 1, 10 can thus be reduced to about 60 μm.

The assembled wafers 1, 10 are then cut alongside the scribing lines 5, 15, which are substantially superposed, in order to obtain preassembled individual micromodules.

It is worth noting that bumps can also be formed on the contact pads 18A, 18B of the coil.

Figure 7:
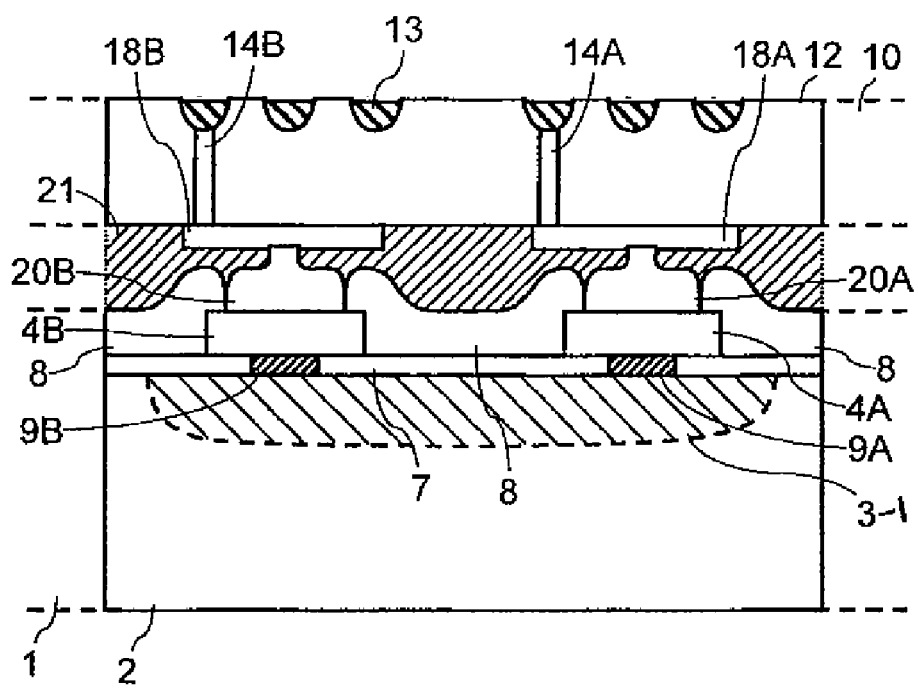
FIG. 7 is a cross-sectional view illustrating a variation of the assembly step of FIG. 6, according to one illustrated embodiment.

In a variation shown by FIG. 7, bumps 20A, 20B with a pointed upper part ("stud bumps") are arranged on the contact pads 4A, 4B of the integrated circuits 3. The assembly of the wafers 1, 10 is made by means of a layer of adhesive or an adhesive film 21 of anisotropic non-conducting or conducting type, which is applied on the active face 1A of the wafer 1 and/or the rear face 12B of the wafer 10. Both wafers are then pressed one against the other so that the pointed part of the bumps 20A, 20B come into contact with the contact pads 18A, 18B. Advantageously, the pointed parts of the bumps slightly embed themselves in the contact pads 18A, 18B. To that purpose, the contact pads 18A, 18B are designed to support the penetration of the bumps and are made in a ductile material, for example aluminium or copper, and the bumps are made in gold or copper, or in a composition of metals or in an eutectic or non-eutectic alloy. Thus the connection of the coil to the integrated circuit is here made by physical contact of the bumps 20A, 20B with the contact pads 18A, 18B of the coil.

It is worth noting that it is also necessary to make vents in the scribing lines in the same way as the vias, to allow gas to be removed from the polymers of the adhesive during the heating of the same.

As previously, the wafers 1 and 10, once assembled, are cut alongside the scribing lines 5, 15 to obtain preassembled micromodules. Before this cutting step, the wafer 1 can also be thinned, so as to reach a total thickness of the assembled wafers 1, 10 of about 60 μm.

The use of stud bumps 20A, 20B allows the thickness of the micromodule to be reduced by several tens of micrometres (ideally about 60 μm) compared to the micromodule shown in FIG. 6, wherein round bumps have been used. However, it is preferable not to form bumps of this type on the contact pads 18A, 18B of the coil, as they may sink into the contact pads of the integrated circuit and damage the integrated circuit during the assembly of the wafers.

Thus, the micromodule according to an embodiment of the invention is obtained from a silicon wafer dedicated to the active region 3-1 of the integrated circuit 3, and from another silicon wafer dedicated to the antenna 13 of the micromodule. The fact that the antenna is made in a dedicated silicon wafer, like the integrated circuit, makes it possible to be freed from the mechanical constraints appearing when the wafer does not have the same properties of thermal dilatation as the integrated circuit. The method according to an embodiment of the invention further has a much higher manufacturing yield than "coil on chip" methods. The method according to the invention is also used to benefit from techniques for thinning silicon wafers, and to manufacture a very thin micromodule.

In the micromodule thus obtained, the active face is covered by the wafer dedicated to the antenna which thus protects the active face against attacks aiming at analysing the operation of the integrated circuit.

The wafer 10 dedicated to the antenna can be a recycled wafer. Indeed, the rear face of the wafer can be used to form the antenna, while the active face of the wafer is suppressed during the thinning step.

The step of thinning the wafer 10 further allows a sufficient contact surface for a good connection to appear.

It is worth noting that, as the wafer 10 covers the active face of the wafer 1, contact pads of the integrated circuit can be hidden by the wafer 10. To access to these contact pads, holes are made in the wafer 10 which face the contact pads to access, and are metallized in the same way as the blind holes 14A, 14B.

In addition to the technological variations which have just been described, the manufacturing method according to the invention is susceptible of other embodiments, in particular regarding the implementation of the steps of cutting and assembling the wafers 1, 10.

Thus, in a second embodiment, the wafer 1 is previously cut according to its scribing lines to obtain several chips 22, each chip 22 comprising an integrated circuit 3 and corresponding to a region 2 of the type described above (FIGS. 1 and 2). Each chip 22 is then assembled on the wafer 10 and is connected to a coil 13 before cutting the wafer 10.

In a third embodiment, the wafer 10 is previously cut according to its scribing lines to obtain several chips 23, each chip 23 comprising an antenna coil 13 and corresponding to a region 12 of the type described above (FIGS. 3, 4 and 5). Each chip 23 is then assembled on the wafer 1 and is connected to an integrated circuit 3 before cutting the wafer 1.

These embodiments particularly make a difference of dimensions possible between the region 12 receiving the coil 13 and the region 2 receiving the integrated circuit 3. If the smaller region is cut before the assembly step, it can be made in greater number out of a same silicon wafer in relation to the other region. The surface of the two wafers can thus be used at the maximum.

It will clearly appear to those skilled in the art that the various manufacturing steps described above, particularly mounting, assembling, connecting and making the contact pads and the electrical links, do not require the implementation of techniques commonly used in the microelectronics industry.

It will also clearly appear to those skilled in the art that the method according to the invention is susceptible of various other embodiments.

Thus, the contact pads 18A, 18B of the coils 13 can be made on the same face as the coils 13. In that case, the front face 12A (FIG. 3) of the wafer 10 is directed toward the active face 1A (FIG. 1) of the wafer 2 during the assembly. The conducting paths 17A, 17B allowing the contact pads of the integrated circuits to coincide with the contact pads of the coils are then preferably made on the wafer 10 rather than on the wafer 2.

In addition, if the wafer 10 is cut before the assembly, the bushings 14A, 14B can be replaced by conducting paths located on a previously bevelled edge of the chips 23.

On the other hand, it can be unnecessary to make the antenna coils 13 in grooves formed in the wafer 10, although it has the advantage to decrease the number of processing steps. Thus, the windings can also be directly made by metal deposit on the surface of the wafer 10, after depositing a barrier layer and possibly an adhesion layer.

Each integrated circuit 3 can comprise in addition other contact pads, particularly test pads or pads allowing the integrated circuit to be connected, in addition to its connection with the antenna coil 13, to contacts of chip card of ISO/IEC 7816 type. In that case, embodiments of the invention are used to manufacture micromodules with two operating modes, i.e., contact and contactless modes.

A micromodule according to embodiments of the invention can also comprise several antenna coils 13, some contactless micromodules using for example a first antenna coil for sending and receiving data and a second antenna coil for receiving electric energy. Thus, in each region 12 of the wafer 10, an antenna coil can be provided on each face of the wafer 10. In each region 12 of the wafer 10, two coils can also be arranged on the same face of the wafer 10, either side by side or superposed and separated by an insulating layer.

Although an application of an embodiment of the invention to the integrated circuits of PICC type have been described above, an antenna of UHF type (for example a Y-shaped antenna) can also be provided instead of the antenna coil 13 described above.

Eventually, the manufacturing method according to the invention can be implemented with any types of wafers able to receive antenna coils and integrated circuits, for example wafers in gallium arsenide AsGa.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method, comprising:
   manufacturing a micromodule, the manufacturing including:
   making an integrated circuit having first contact pads;
   making an antenna coil having second contact pads electrically connected to the first contact pads of the integrated circuit, wherein the integrated circuit and the first contact pads are made on a first chip of semiconductor material, the antenna coil and the second contact pads are made on a second chip of semiconductor material; and
   assembling the first and second chips face to face, putting the second contact pads of the antenna coil in contact with the first contact pads of the integrated circuit, wherein the first contact pads are arranged on the integrated circuit to respectively correspond to the second contact pads of the antenna coil.

2. The method according to claim 1, wherein:
   the integrated circuit and the first contact pads are formed on a first face of the first chip;
   a conductive winding of the antenna coil is formed on a first face of the second chip;
   the second contact pads of the antenna coil are formed on a second face of the second chip; and
   the first and second chips are assembled by arranging the first face of the first chip facing the second face of the second chip.

3. The method according to claim 2, comprising:
   forming holes through the second chip between the first face on which the conductive winding is formed and the second face of the second chip; and
   filling in the holes with a conductive material to obtain electrically conducting bushings linking the conductive winding to the second contact pads of the antenna coil.

4. The method according to claim 3, wherein forming the holes comprises a step of forming blind holes on the first face of the second chip and a step of thinning the second chip so that the blind holes open onto the second face of the second chip.

5. The method according to claim 1, comprising:
   forming a groove having a winding shape on the second chip; and
   filling in the groove with an electrically conducting material, to obtain a conductive winding of the antenna coil.

6. The method according to claim 1, comprising a step of forming bumps of an electrically conducting material on the second contact pads of the antenna coil or on the first contact pads of the integrated circuit, so that an electrical contact is established by the bumps between the second contact pads of the antenna coil and the first contact pads of the integrated circuit, after assembling the chips.

7. The method according to claim 6, wherein the bumps are of a material selected from the group consisting of a metal, a composition of metals, an eutectic alloy and a non-eutectic hard alloy.

8. The method according to claim 6, comprising a step of applying a treatment to the bumps, including fusing, creep or adhesion.

9. The method according to claim 1, comprising a step of depositing a polymer material on the first chip or on the second chip to assemble both chips.

10. A method according to claim 1 wherein manufacturing the micromodule includes collectively manufacturing micromodules, the collectively manufacturing micromodules comprising:
    collectively manufacturing a plurality of integrated circuits and contact pads on a first wafer;
    collectively manufacturing a plurality of conductive windings forming a plurality of antenna coils on a second wafer;
    connecting each of the conductive windings to the integrated circuits, respectively, while assembling the first and second wafers; and
    cutting the wafers after assembling the wafers, to obtain individual micromodules.

11. A method according to claim 1 wherein manufacturing the micromodule includes collectively manufacturing micromodules, the collectively manufacturing micromodules comprising:
    collectively manufacturing a plurality of integrated circuits and contact pads on a first wafer;
    collectively manufacturing a plurality of conducting windings forming a plurality of antenna coils on a second wafer;
    cutting the second wafer to obtain a plurality of chips, each of the plurality of chips having a surface substantially corresponding to a respective one of the plurality of integrated circuits on the first wafer;
    assembling chips with the first wafer, wherein each of the plurality of chips having a respective one of the plurality of antenna coils, so that each antenna coil is connected to a respective one of the plurality of integrated circuits; and
    cutting the first wafer after assembling it with the plurality of chips, to obtain individual micromodules.

12. A method according to claim 1 wherein manufacturing the micromodule includes collectively manufacturing micromodules, the collectively manufacturing micromodules comprising:
    collectively manufacturing a plurality of integrated circuits and contact pads on a first wafer;

collectively manufacturing a plurality of conducting windings forming a plurality of antenna coils on a second wafer;

cutting the first wafer to obtain a plurality of chips, each of the plurality of chips having a surface substantially matching a location on the second wafer of a respective one of the antenna coils;

assembling the plurality of chips with the second wafer, wherein each of the plurality of chips has a respective one of the plurality of integrated circuits, so that each of the plurality of antenna coils is connected to a respective one of the plurality of integrated circuits; and cutting the second wafer after assembling it with the chips, to obtain individual micromodules.

13. A micromodule comprising:

an integrated circuit having first contact pads; and at least one antenna coil having second contact pads electrically connected to the first contact pads of the integrated circuit, wherein the integrated circuit and the first contact pads are made on a first chip of semiconductor material, the antenna coil and the second contact pads are made on a second chip of semiconductor material, and the first and second chips are assembled face to face, putting the second contact pads of the coil in contact with the first contact pads of the integrated circuit, wherein the first contact pads are arranged on the integrated circuit to respectively correspond to the second contact pads of the antenna coil.

14. The micromodule according to claim 13 wherein:

the integrated circuit and the first contact pads are arranged on a first face of the first chip;

the antenna coil is arranged on a first face of the second chip;

the second contact pads of the coil are arranged on a second face of the second chip; and the first face of the first chip is facing the second face of the second chip.

15. The micromodule according to claim 14 wherein the second chip comprises holes filled with conducting material through the second chip and linking the antenna coil on the first face of the second chip to the second contact pads of the coil on the second face of the second chip.

16. The micromodule according to claim 13 wherein the antenna coil comprises a conducting material arranged in a groove having a winding shape and positioned on the first face of the second chip.

17. The micromodule according to claim 13, further comprising electrically conducting bumps linking the second contact pads of the antenna coil to the first contact pads of the integrated circuit, wherein the first contact pads are arranged on the integrated circuit to respectively correspond to the second contact pads of the antenna coil.

18. The micromodule according to claim 13, further comprising a polymer material electrically connecting the second contact pads of the antenna coil with the corresponding first contact pads of the integrated circuit.

* * * * *

UNITED STATES PATENT AND TRADEMARK OFFICE
CERTIFICATE OF CORRECTION

PATENT NO. : 7,667,329 B2  
APPLICATION NO. : 11/561699  
DATED : February 23, 2010  
INVENTOR(S) : Agnes Rogge It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 560 days.

Signed and Sealed this

Seventh Day of December, 2010

David J. Kappos  
*Director of the United States Patent and Trademark Office*